(12) United States Patent
Hashimoto (10) Patent No.: US 8,704,540 B2
(45) Date of Patent: Apr. 22, 2014

(54) TEST APPARATUS

(75) Inventor: Kenji Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 166 days.

(21) Appl. No.: 13/253,976

(22) Filed: Oct. 6, 2011

(65) Prior Publication Data

US 2012/0153974 A1    Jun. 21, 2012

(30) Foreign Application Priority Data

Dec. 15, 2010  (JP) ................................. 2010-279619

(51) Int. Cl.
*G01R 31/00*    (2006.01)
(52) U.S. Cl.
USPC ..................................................... 324/750.01
(58) Field of Classification Search
USPC .................. 324/762.01–762.1, 750.01–750.3; 257/48; 438/14–18
See application file for complete search history.

(56) References Cited

U.S. PATENT DOCUMENTS 5,402,079 A *  3/1995 Levy ......................... 324/762.02
6,396,298 B1 *  5/2002 Young et al. ............. 324/762.09

FOREIGN PATENT DOCUMENTS

| JP | S62-220877 A | 9/1987 |
| JP | S64-053174 A | 3/1989 |
| JP | H08-308094 A | 11/1996 |
| JP | 2007-33042 A | 2/2007 |

OTHER PUBLICATIONS

Office Action for Japanese Patent Application No. 2010-279619, issued by the Japanese Patent Office on Dec. 17, 2013.

* cited by examiner

*Primary Examiner* — Tung X Nguyen (57) ABSTRACT

Provided is a test apparatus that tests a device under test, comprising a power supply section that generates a power supply voltage to be supplied to the device under test; an inductive load section provided in a path between the power supply section and the device under test; a plurality of semiconductor switches connected in series in a path between the inductive load section and the device under test; and a control section that turns OFF the semiconductor switches when a supply of voltage to the device under test is stopped.

12 Claims, 7 Drawing Sheets

TEST APPARATUS

BACKGROUND

1. Technical Field

The present invention relates to a test apparatus.

2. Related Art

When manufacturing a semiconductor switch, such as an IGBT, that switches current flowing though an inductive load, an avalanche breakdown test is performed. Patent Document 1 describes a test apparatus that performs an avalanche breakdown test.

Patent Document 1: Japanese Patent Application Publication No. 2007-33042

However, when the device under test malfunctions in a short-circuit mode during testing of the avalanche breakdown voltage, an excessive current flows through the device under test. Therefore, damage spreads in the device under test and it becomes difficult to analyze the source of the malfunction. Furthermore, the excessive current flowing through the device under test can damage the test apparatus itself.

In order to prevent such occurrences, a test apparatus that tests avalanche breakdown voltage must quickly cut off the connection between the inductive load and the device under test when an abnormal current flows to the device under test. However, a switching device that can perform high-speed switching and has a high withstand voltage is expensive, and this increases the cost of the overall test apparatus.

SUMMARY

In order to solve the above problems, according to a first aspect of the present invention, provided is a test apparatus that tests a device under test, comprising a power supply section that generates a power supply voltage to be supplied to the device under test; an inductive load section provided in a path between the power supply section and the device under test; a plurality of semiconductor switches connected in series in a path between the inductive load section and the device under test; and a control section that turns OFF the semiconductor switches when a supply of voltage to the device under test is stopped.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
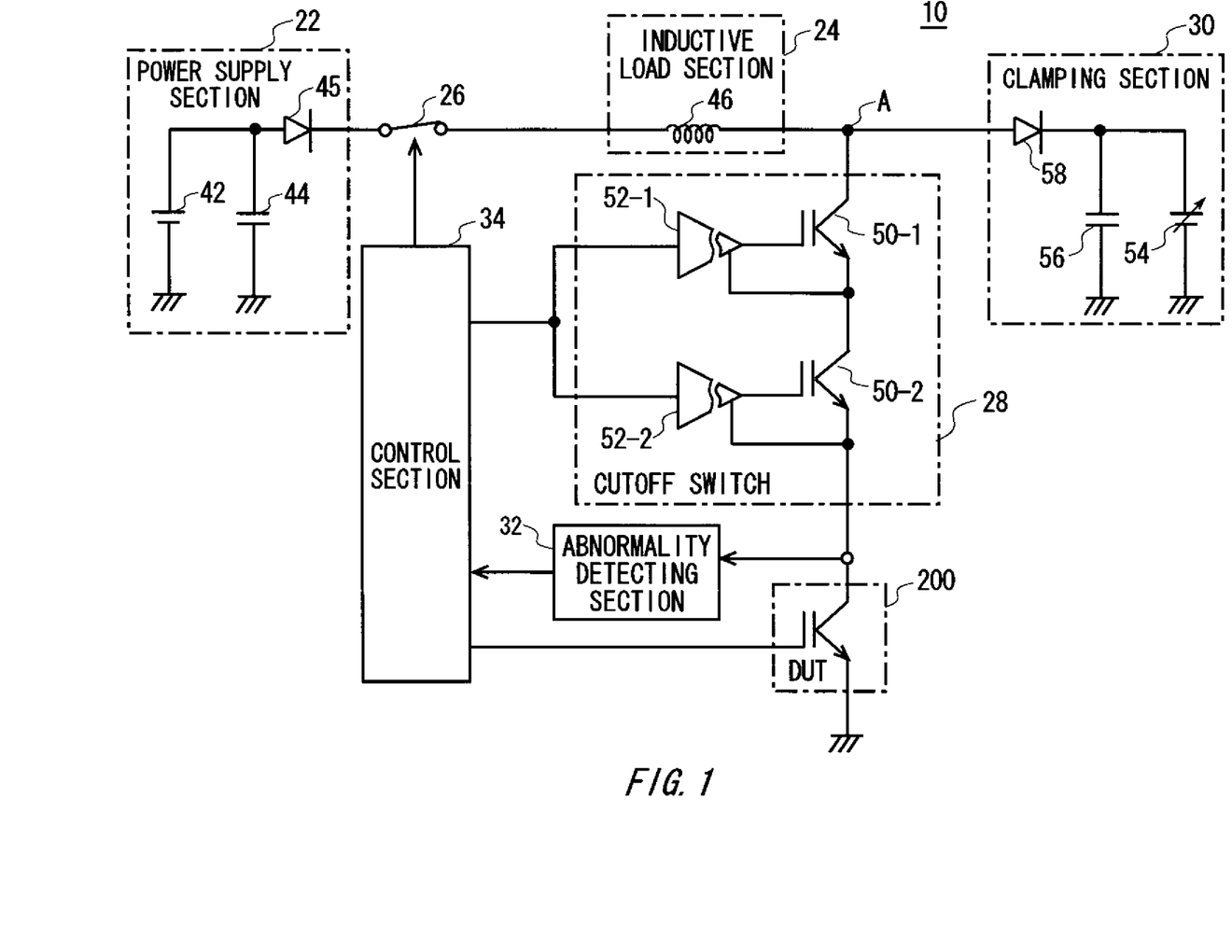
FIG. 1 shows an exemplary configuration of a test apparatus 10 according to an embodiment of the present invention, together with a device under test 200.

FIG. 1 shows an exemplary configuration of a test apparatus 10 according to an embodiment of the present invention, together with a device under test 200. The test apparatus 10 of the present embodiment tests the avalanche breakdown voltage of a device under test 200, which is a semiconductor switch. In the present embodiment, the device under test 200 is an isolated-gate bipolar transistor (IGBT).

The test apparatus 10 includes a power supply section 22, an inductive load section 24, a power supply switch 26, a cutoff switch 28, a clamping section 30, an abnormality detecting section 32, and a control section 34.

The power supply section 22 generates a power supply voltage to be supplied to the device under test 200. The power supply section 22 may generate a DC power supply voltage from 600 V to 2500 V, for example. In the present embodiment, the power supply section 22 applies the power supply voltage to the collector-emitter junction of the device under test 200, which is an IGBT. More specifically, the emitter of the device under test 200 is connected to a ground. The power supply section 22 applies a positive power supply voltage to the collector of the device under test 200.

The power supply section 22 may include a DC power supply section 42, a power supply capacitor 44, and a power supply diode 45. The negative terminal of the DC power supply section 42 is connected to the ground. The power supply capacitor 44 is connected between the ground and the positive terminal of the DC power supply section 42. The anode of the power supply diode 45 is connected to the positive terminal of the DC power supply section 42. The power supply section 22 generates the power supply voltage from the cathode of the power supply diode 45.

The inductive load section 24 has an inductance, and is provided in a path between the power supply section 22 and the device under test 200. The inductive load section 24 may be an inductor 46, for example. In the present embodiment, the inductive load section 24 is provided between the end of the power supply section 22 at which the power supply voltage is generated and the collector of the device under test 200, which is an IGBT.

The inductive load section 24 may include a plurality of inductors 46 with different inductances that are switched such that one inductor is connected to the path. In this way, the inductive load section 24 can provided an inductance corresponding to the testing content and the type of the device under test 200 in the path between the power supply section 22 and the device under test 200.

The power supply switch 26 provides a connection or a disconnection between the power supply section 22 and the inductive load section 24. The power supply switch 26 provides a connection between the power supply section 22 and the inductive load section 24 during testing, and disconnects the inductive load section 24 from the power supply section 22 when testing is not being performed. The power supply switch 26 may be a semiconductor switch such as a relay or an IGBT, for example.

The cutoff switch 28 is provided in the path between the inductive load section 24 and the device under test 200. In the present embodiment, the cutoff switch 28 is provided in the path between the terminal of the inductive load section 24 that is not connected to the power supply section 22 and the collector of the device under test 200, which is an IGBT. The cutoff switch 28 provides a connection between the inductive load section 24 and the device under test 200 during normal operation, and disconnects the device under test 200 from the inductive load section 24 when an abnormality occurs.

The cutoff switch 28 includes a plurality of semiconductor switches 50 and a plurality of isolation amplifiers 52. The semiconductor switches 50 are connected in series in the path between the inductive load section 24 and the device under test 200.

In the present embodiment, each semiconductor switch 50 is an insulated-gate bipolar transistor (IGBT), and the collector-emitter junctions thereof are connected in series. In other words, the semiconductor switch 50 arranged closest to the inductive load section 24 has its collector connected to the inductive load section 24 and its emitter connected to the collector of the semiconductor switch 50 adjacent on the device under test 200 side thereof.

The semiconductor switch 50 arranged closest to the device under test 200 has its emitter connected to the collector of the device under test 200. Semiconductor switches 50 other than the semiconductor switch 50 arranged closest to the inductive load section 24 and the semiconductor switch 50 arranged closest to the device under test 200 each have an emitter connected to the collector of the semiconductor switch 50 adjacent on the device under test 200 side.

The isolation amplifiers 52 correspond respectively to the semiconductor switches 50. Each isolation amplifier 52 turns the corresponding semiconductor switch 50 ON and OFF according to a control signal received from the outside. In the present embodiment, each isolation amplifier 52 turns ON (connects) and turns OFF (disconnects) the collector-emitter junction by controlling the gate voltage of the corresponding semiconductor switch 50, which is an IGBT.

Furthermore, each isolation amplifier 52 isolates the external circuit that outputs the control signal from the corresponding semiconductor switch 50. As a result, each isolation amplifier 52 can prevent a high voltage that is supplied from the power supply section 22 to the device under test 200 from being supplied to the external circuit that outputs the control signal.

In the example shown in FIG. 1, the cutoff switch 28 includes a first semiconductor switch 50-1, a second semiconductor switch 50-2, a first isolation amplifier 52-1, and a second isolation amplifier 52-2. The collector-emitter junctions of the first semiconductor switch 50-1 and the second semiconductor switch 50-2 are connected in series.

The first semiconductor switch 50-1 is arranged on the inductive load section 24 side. The second semiconductor switch 50-2 is arranged on the device under test 200 side. The first isolation amplifier 52-1 generates the gate voltage of the first semiconductor switch 50-1, according to a control signal received from the outside. The second isolation amplifier 52-2 generates the gate voltage of the second semiconductor switch 50-2, according to a control signal received from the outside.

The clamping section 30 limits the voltage of the path between the inductive load section 24 and the cutoff switch 28, namely a connection point A, to be within a preset range. In the present embodiment, the clamping section 30 controls the voltage of the connection point A such that this voltage does not exceed a predetermined clamp voltage that is higher than the power supply voltage, e.g. a voltage that is tens of percents higher than the power supply voltage.

The clamping section 30 may include a variable voltage source 54, a clamping capacitor 56, and a diode 58, for example. The negative terminal of the variable voltage source 54 is connected to the ground, and the variable voltage source 54 generates a clamp voltage set from the outside. The clamping capacitor 56 is connected between the ground and the positive terminal of the variable voltage source 54.

The anode of the diode 58 is connected to the connection point A, which is in the path between the inductive load section 24 and the cutoff switch 28, and the cathode of the diode 58 is connected to the positive terminal of the variable voltage source 54. When the potential of the connection point A becomes greater than or equal to the clamp voltage, the clamping section 30 turns ON the diode 58 and absorbs the current flowing through the connection point A. In this way, the clamping section 30 can limit the potential of the connection point A to be less than or equal to the clamp voltage.

The abnormality detecting section 32 detects whether the test apparatus 10 is operating abnormally. For example, the abnormality detecting section 32 may detect that an abnormal voltage is generated or that an abnormal current is flowing through the device under test 200. As another example, the abnormality detecting section 32 may detect abnormal operation to be when the temperature of the device under test 200 exceeds a predetermined value.

The control section 34 controls the power supply switch 26. More specifically, the control section 34 turns ON the power supply switch 26 when testing is begun, and turns OFF the power supply switch 26 when testing is finished. In this way, the control section 34 can supply the device under test 200 with the power supply power generated by the power supply section 22, via the inductive load section 24, during testing.

The control section 34 controls the device under test 200. In the present embodiment, the control section 34 supplies the gate voltage of the device under test 200, which is an IGBT, to turn the device under test 200 ON and OFF.

The control section 34 controls the cutoff switch 28. In the present embodiment, the control section 34 turns ON the plurality of semiconductor switches 50 in the cutoff switch 28 when the voltage is being supplied to the device under test 200. The control section 34 turns OFF the semiconductor switches 50 in the cutoff switch 28 when the supply of the voltage to the device under test 200 is stopped.

More specifically, the control section 34 turns ON the semiconductor switches 50 during normal operation, i.e. when the abnormality detecting section 32 does not detect abnormal operation. Furthermore, the control section 34 turns OFF the semiconductor switches 50 when an abnormality occurs during testing, i.e. when the abnormality detecting section 32 detects abnormal operation. In this way, the control section 34 can stop the supply of current to the device under test 200 when an abnormality occurs.

Figure 2:
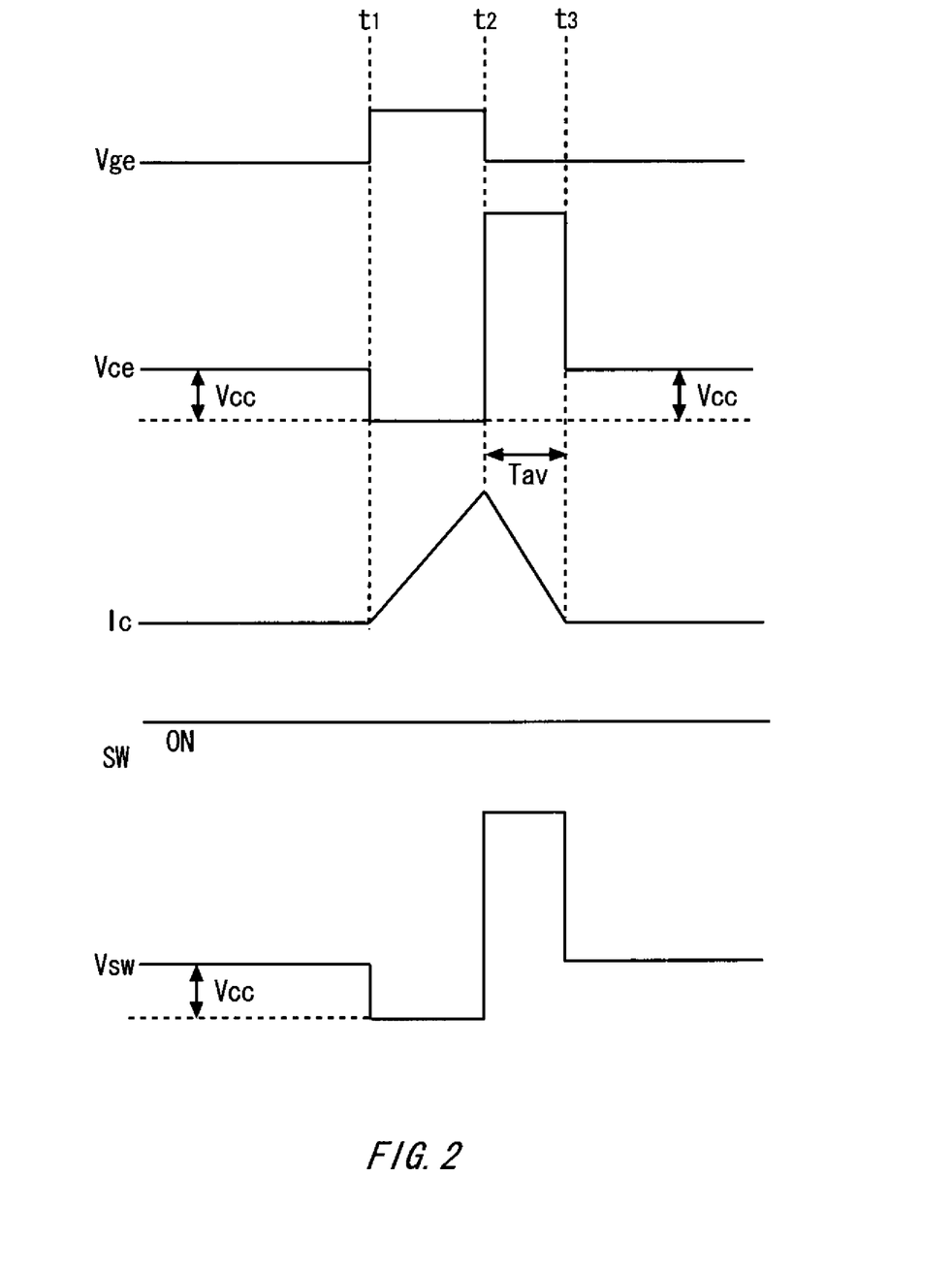
FIG. 2 shows exemplary waveforms of the gate voltage of the device under test 200, the collector-emitter voltage of the device under test 200, the collector current of the device under test 200, the control signal of the cutoff switch 28, and the voltage at the connection point A when the device under test 200 operates normally during testing of the avalanche breakdown voltage of the device under test 200, which his an IGBT.

FIG. 2 shows exemplary waveforms of the gate voltage of the device under test 200, the collector-emitter voltage of the device under test 200, the collector current of the device under test 200, the control signal of the cutoff switch 28, and the voltage at the connection point A when the device under test 200 operates normally during testing of the avalanche breakdown voltage of the device under test 200, which his an IGBT. In FIG. 2, Vge represents the gate voltage, i.e. the gate-emitter voltage, of the device under test 200, Vce represents the collector-emitter voltage of the device under test 200, Ic represents the collector current of the device under test 200, SW represents the waveform of the control signal of the cutoff switch 28, and Vsw represents the potential of connection point A, which is the path between the inductive load section 24 and the cutoff switch 28.

When testing the avalanche breakdown voltage of the device under test 200, which is an IGBT, first, the control section 34 turns OFF the device under test 200 and turns ON the power supply switch 26. Furthermore, since no abnormality is detected, the control section 34 turns ON the cutoff switch 28. After the device under test 200 is turned OFF and the power supply switch 26 is turned ON, the potential Vsw at the connection point A is the power supply voltage Vcc. The collector-emitter voltage Vce of the device under test 200 is also the power supply voltage Vcc.

The control section 34 keeps the power supply switch 26 turned ON. Furthermore, until an abnormality is detected, the control section 34 keeps the cutoff switch 28 turned ON.

Next, at the time t1, the control section 34 switches the device under test 200 from OFF to ON. After the device under test 200 is turned ON at the time t1, the collector-emitter voltage Vce of the device under test 200 becomes a voltage corresponding to the characteristics of the device under test 200. Furthermore, the potential Vsw at the connection point A becomes a voltage that is shifted from the collector-emitter voltage Vce by an amount equal to the ON voltage of the cutoff switch 28.

After the device under test 200 is turned ON at the time t1, the collector current Ic of the device under test 200 increases at a rate corresponding to the inductance of the inductive load section 24. Energy is accumulated in the inductive load section 24 due to the power supplied from the power supply section 22.

Next, at the time t2, which is a predetermined time after the time t1, the control section 34 switches the device under test 200 from ON to OFF. When the device under test 200 is switched from ON to OFF, the current flowing through the inductive load section 24 is stopped and the inductive load section 24 generates a back electromotive force. Accordingly, after the device under test 200 is turned OFF at the time t2, the potential Vsw at the connection point A increases to a voltage obtained as the sum of the power supply potential Vcc generated from the power supply section 22 and a voltage corresponding to the back electromotive force of the inductive load section 24.

After the device under test 200 is turned OFF at the time t2, the inductive load section 24 discharges the energy accumulated from the time t1 to the time t2 as a current. The device under test 200 absorbs the current discharged from the inductive load section 24, as a result of the collector current Ic flowing.

Accordingly, after the device under test 200 is turned OFF at the time t2, the device under test 200 causes the collector current Ic to flow until all of the energy accumulated in the inductive load section 24 is discharged. The collector current Ic decreases at a rate corresponding to the inductance of the inductive load section 24. The period during which the energy accumulated in the inductive load section 24 is discharged as current is referred to as the avalanche period Tav.

Next, when all of the energy accumulated in the inductive load section 24 has been discharged (time t3), the collector current Ic becomes 0. Since the back electromotive force generated by the inductive load section 24 is also 0, the potential Vsw at the connection point A becomes the power supply voltage Vcc. Furthermore, the collector-emitter voltage Vce of the device under test 200 also becomes the power supply voltage Vcc.

The test apparatus 10 controls the device under test 200 in the manner described above during testing of the avalanche breakdown voltage. When the above operation is performed normally, i.e. when the device under test 200 does not break down due to an excessive current flowing therethrough, the test apparatus 10 judges the device under test 200 to be nondefective.

Figure 3:
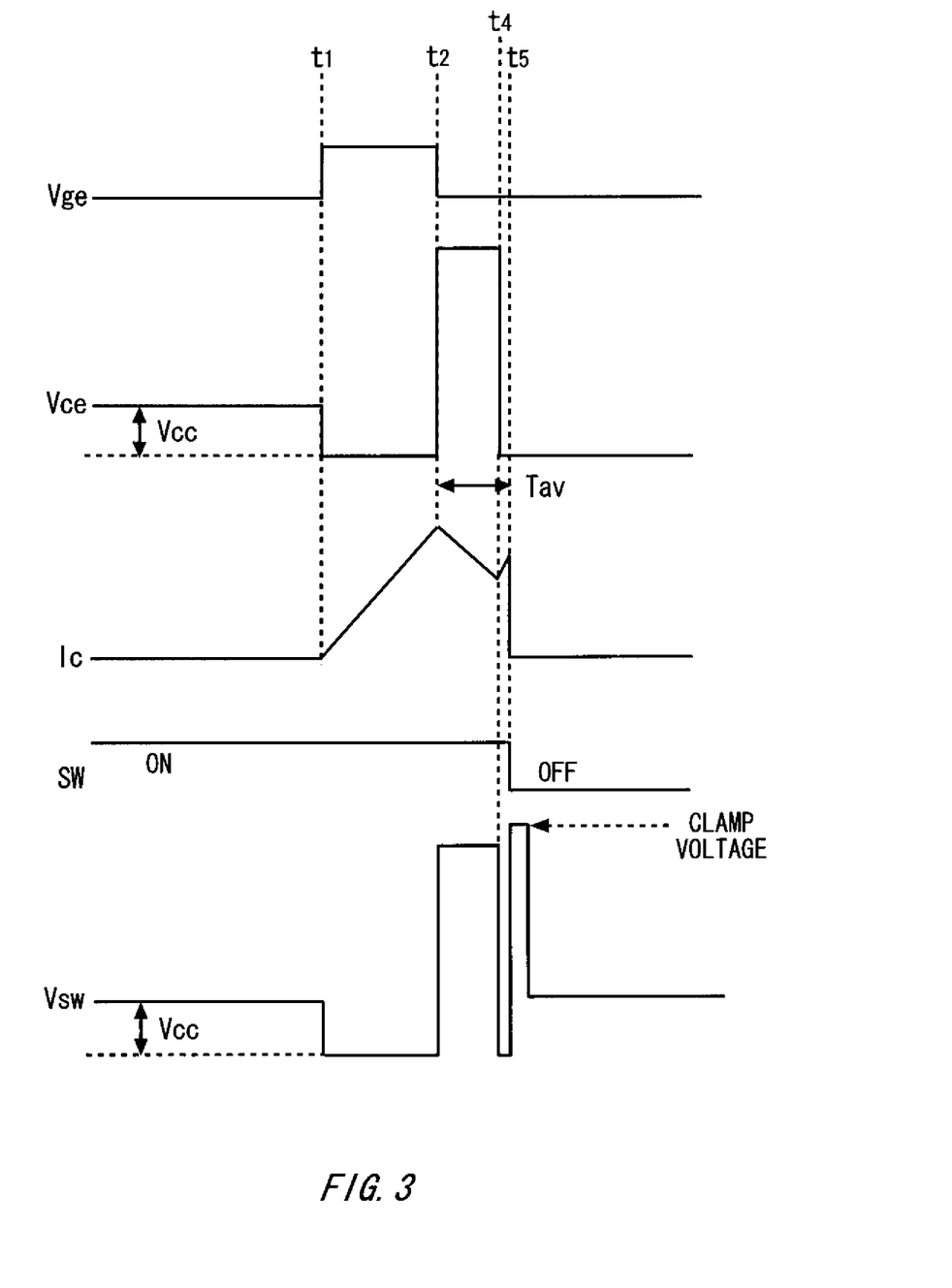
FIG. 3 shows exemplary waveforms of the gate voltage, the collector-emitter voltage, and the collector current of the device under test 200, the control signal of the cutoff switch 28, and the voltage of the connection point A when the device under test 200 is operating abnormally during testing of the avalanche breakdown voltage of the device under test 200, which is an IGBT.

FIG. 3 shows exemplary waveforms of the gate voltage, the collector-emitter voltage, and the collector current of the device under test 200, the control signal of the cutoff switch 28, and the voltage of the connection point A when the device under test 200 is operating abnormally during testing of the avalanche breakdown voltage of the device under test 200, which is an IGBT. In FIG. 3, Vge, Vce, Ic, SW, and Vsw represent the same waveforms as in FIG. 2.

Here, it is assumed that the device under test 200 malfunctions during testing. In this case, an abnormality occurs in the operation of the device under test 200.

For example, it may be assumed that the device under test 200 malfunctions in the short-circuit mode at the time t4 during the avalanche period Tav. In this case, the collector current Ic increases quickly. Furthermore, the potential Vsw at the connection point A drops due to the short circuiting of the device under test 200.

If the device under test 200 malfunctions in this way, when the collector current Ic continues flowing to the device under test 200, there is a high chance that the increase of the collector current Ic will cause the device under test 200 to break down. When the device under test 200 malfunctions in this way, the abnormality detecting section 32 of the present embodiment notifies the control section 34 that an abnormality has occurred. For example, the abnormality detecting section 32 may detect that the collector current Ic has increased quickly during the avalanche period, and notify the control section 34 of this.

In response to receiving the notification from the abnormality detecting section 32, the control section 34 switches the semiconductor switches 50 of the cutoff switch 28 from ON to OFF (time t5). As a result, when the device under test 200 malfunctions in this way, the control section 34 can prevent the collector current Ic from quickly flowing to the device under test 200. At this time, the potential Vsw of the connection point A increases due to the back electromotive force of the inductive load section 24, but this increase is limited by the clamp voltage. After a certain time has passed, the potential Vsw of the connection point A drops to the power supply voltage Vcc.

In this way, the test apparatus 10 can prevent excessive current from causing the breakdown of the device under test 200 or the test apparatus 10 itself when testing the avalanche breakdown voltage of the device under test 200, which is an IGBT.

Figure 4:
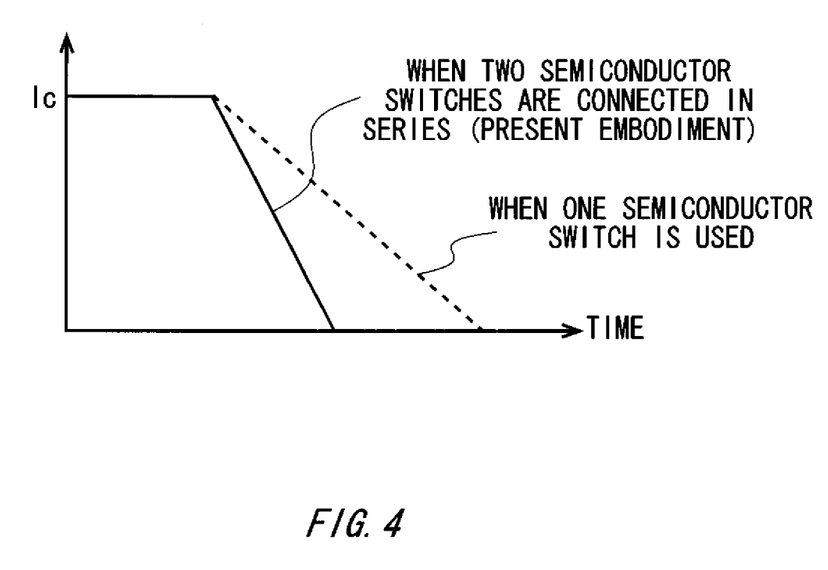
FIG. 4 shows an exemplary waveform of current flowing through the device under test 200 when the collector current Ic is stopped by the cutoff switch 28.

FIG. 4 shows exemplary waveforms of current flowing through the device under test 200 when the collector current Ic between the inductive load section 24 and the device under test 200 is stopped, according to the present embodiment. As shown by the example of FIG. 4, the cutoff period necessary to stop the collector current Ic using two serially connected semiconductor switches is shorter than the cutoff period necessary to stop the collector current Ic using a single semiconductor switch.

In the present embodiment, the cutoff switch 28 turns ON (connects) and turns OFF (disconnects) the path between the inductive load section 24 and the device under test 200 using a plurality of serially connected semiconductor switches 50. Accordingly, the cutoff switch 28 can turn OFF the path between the connection point A and the device under test 200 more quickly than when a single semiconductor switch 50 is used to switch this path from ON to OFF.

As a result, when an abnormality occurs during testing, the test apparatus 10 of the present embodiment can quickly stop the current flowing between the inductive load section 24 and the device under test 200. Accordingly, the test apparatus 10 can stop the excessive current before reaching the device under test 200, thereby preventing breakdown of the device under test 200 and the test apparatus 10 itself.

Furthermore, each semiconductor switch 50 may have a relatively low withstand voltage, thereby allowing lower-cost semiconductor switches 50 to be used. Each semiconductor switch 50 may be an IGBT with lower withstand voltage than the device under test 200, which is also an IGBT. In this way, the cost of the test apparatus 10 can be lowered.

Figure 5:
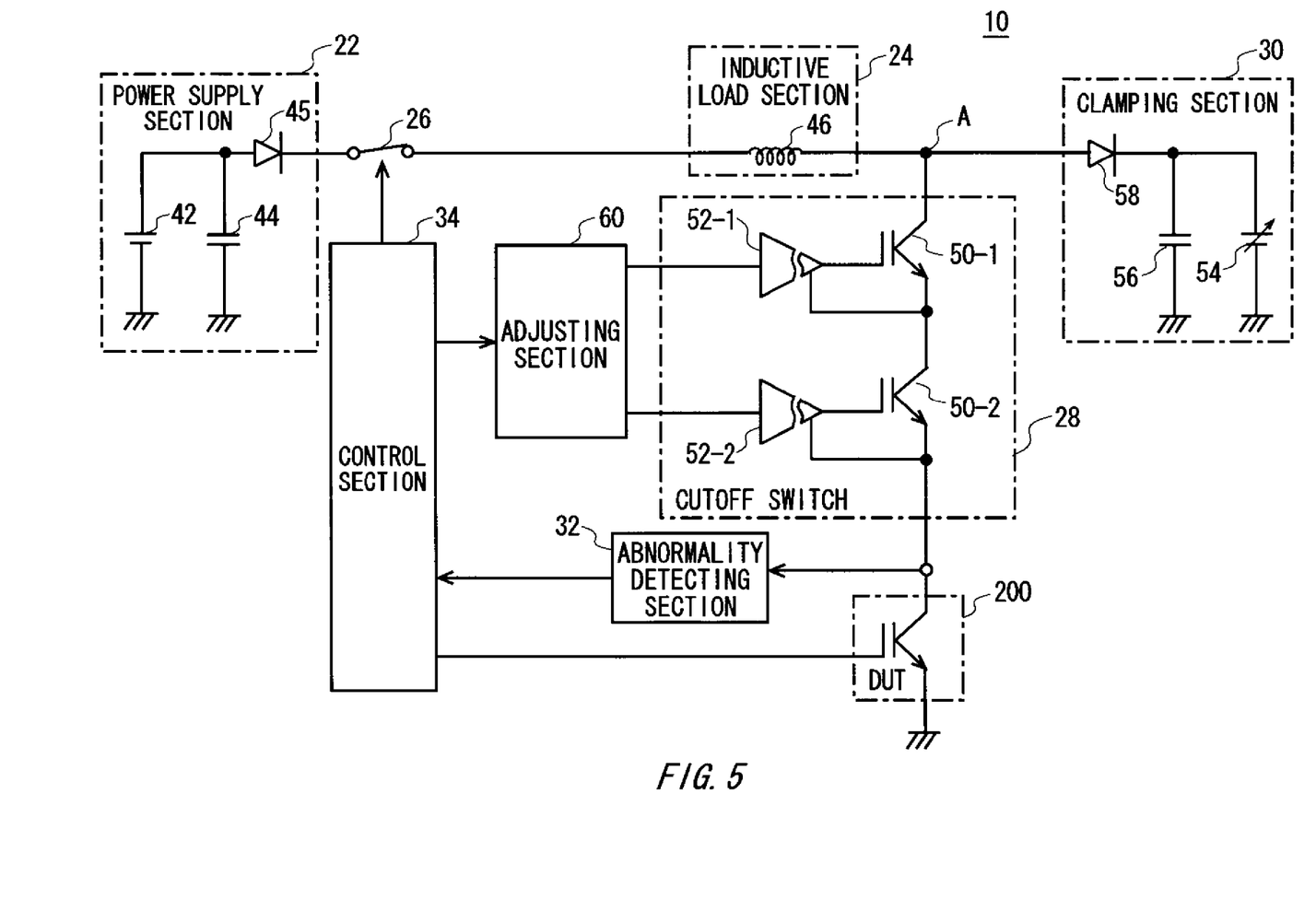
FIG. 5 shows a configuration of the test apparatus 10 according to a first modification of the present embodiment, along with the device under test 200.

FIG. 5 shows a configuration of the test apparatus 10 according to a first modification of the present embodiment, along with the device under test 200. Components of the test apparatus 10 of the present modification adopt substantially the same function and configuration as the components having the same reference numerals shown in FIG. 1, and therefore the following description includes only differing points.

The test apparatus 10 of the present modification further includes an adjusting section 60. The adjusting section 60 adjusts the waveform of each of the control signals for turning ON and OFF the semiconductor switches 50 of the cutoff switch 28. The adjusting section 60 can adjust the timing at which each semiconductor switch 50 is turned from ON to OFF and from OFF to ON.

Figure 6:
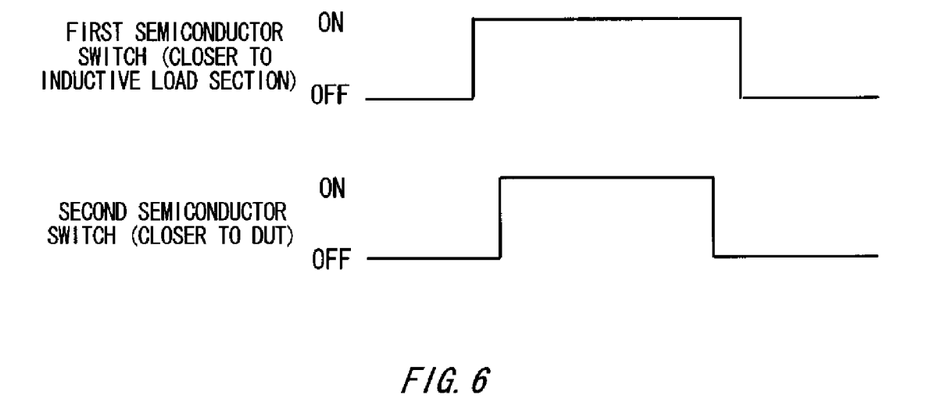
FIG. 6 shows exemplary controls signals with input timings that are changed for each of the first semiconductor switch 50-1 and the second semiconductor switch 50-2.

FIG. 6 shows exemplary controls signals with input timings that are changed for each of the first semiconductor switch 50-1 and the second semiconductor switch 50-2. The adjusting section 60 adjusts the input timing at which each control signal is input to the corresponding semiconductor switch 50, for example.

In this case, when turning each semiconductor switch 50 from OFF to ON, the adjusting section 60 may cause the input timing of the control signals to be later for semiconductor switches 50 that are closer to the device under test 200. In this way, when the semiconductor switches 50 transition from OFF to ON, the adjusting section 60 can cause the semiconductor switch 50 closer to the ground potential, i.e. the semiconductor switch 50 in the device under test 200 side, to be turned ON last.

When turning the semiconductor switches 50 from ON to OFF, the adjusting section 60 may cause the input timing of the control signals to be earlier for semiconductor switches 50 that are closer to the device under test 200. In this way, when the semiconductor switches 50 transition from ON to OFF, the adjusting section 60 can cause the semiconductor switch 50 closer to the ground potential, i.e. the semiconductor switch 50 on the device under test 200 side, to be turned ON first.

When the inductive load section 24 generates an excessive voltage, the adjusting section 60 can apply an averaged voltage to the plurality of semiconductor switches 50, i.e. the adjusting section 60 does not apply the excessive voltage to only one semiconductor switch 50, and can therefore prevent the semiconductor switches 50 from malfunctioning.

Figure 7:
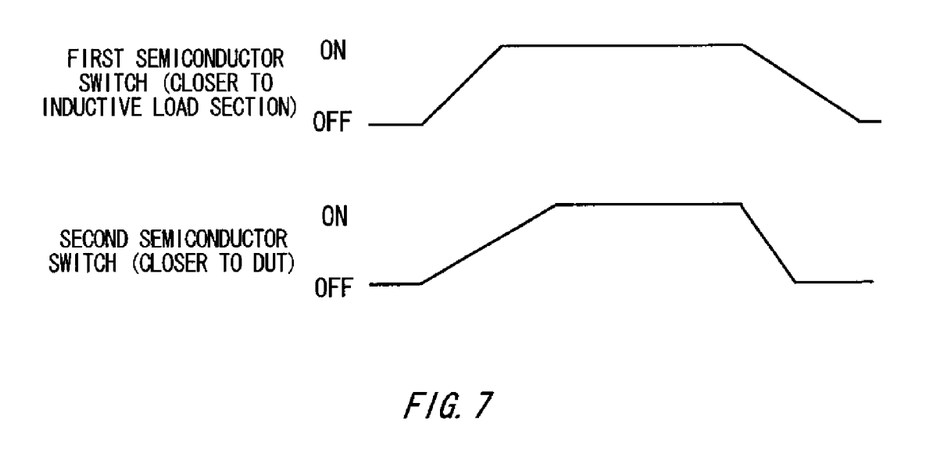
FIG. 7 shows exemplary control signals for which the rate of change is changed respectively for the first semiconductor switch 50-1 and the second semiconductor switch 50-2.

FIG. 7 shows exemplary control signals for which the rate of change is changed respectively for the first semiconductor switch 50-1 and the second semiconductor switch 50-2. The adjusting section 60 may adjust the rate of change for each of a plurality of control signals, for example.

In this case, when turning the semiconductor switches 50 from OFF to ON, the adjusting section 60 causes a lower rate of change for control signals corresponding to semiconductor switches 50 closer to the device under test 200. In this way, when the semiconductor switches 50 transition from OFF to ON, the adjusting section 60 can cause the semiconductor switch closer to the ground potential, i.e. the semiconductor switch 50 on the device under test 200 side, to be turned ON last.

When turning the semiconductor switches 50 from ON to OFF, the adjusting section 60 causes a higher rate of change for control signals corresponding to semiconductor switches 50 closer to the device under test 200. In this way, when the semiconductor switches 50 transition from ON to OFF, the adjusting section 60 can cause the semiconductor switch closer to the ground potential, i.e. the semiconductor switch 50 on the device under test 200 side, to be turned ON first.

When the inductive load section 24 generates an excessive voltage, this adjusting section 60 can apply an averaged voltage to the plurality of semiconductor switches 50, i.e. the adjusting section 60 does not apply the excessive voltage to only one semiconductor switch 50, and can therefore prevent the semiconductor switches 50 from malfunctioning.

Figure 8:
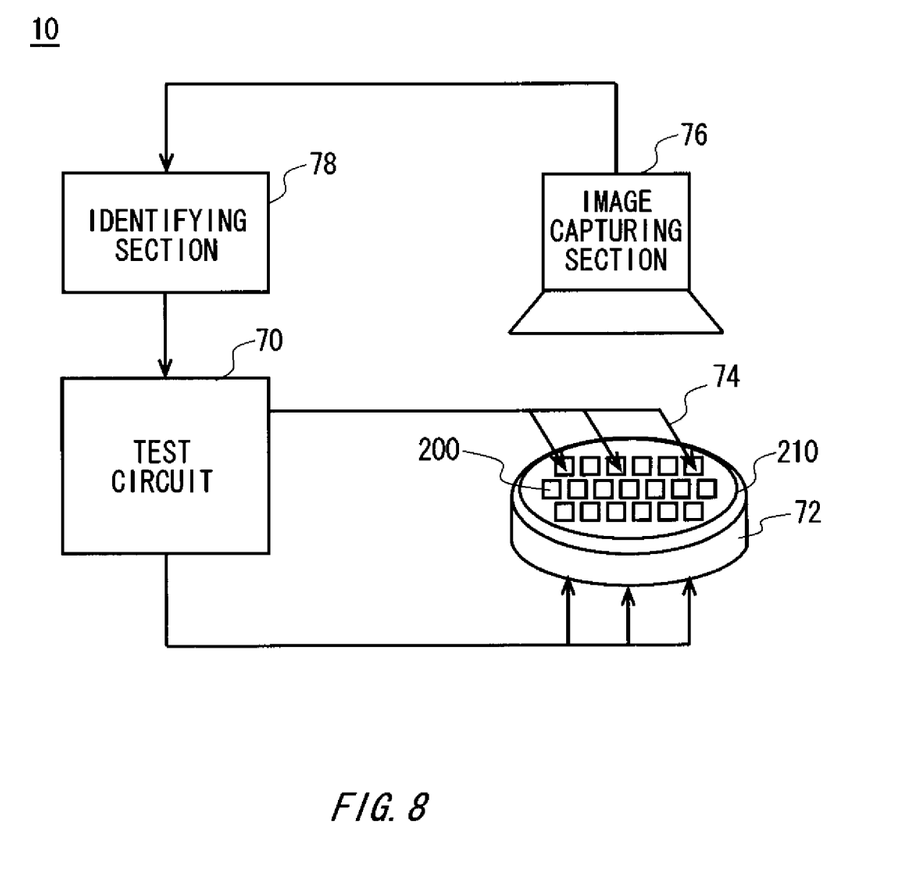
FIG. 8 shows a configuration of the test apparatus 10 according to a second modification of the present embodiment, together with the device under test 200.

FIG. 8 shows a configuration of the test apparatus 10 according to a second modification of the present embodiment, together with the device under test 200. The test apparatus 10 of the present modification adopts substantially the same function and configuration as the test apparatus 10 described in relation to FIGS. 1 to 7, and therefore the following description includes only differing points.

The test apparatus 10 performs the avalanche breakdown voltage test in parallel on a plurality of devices under test 200 formed on a wafer unit 210. The wafer unit 210 may be a tray holding a plurality of devices under test 200 arranged in a wafer shape. The wafer unit 210 may be a component, such as a unit under test, that holds a plurality of devices under test 200 arranged in a shape other than a wafer.

In the present embodiment, each device under test 200 is an IGBT. The test apparatus 10 includes a test circuit 70, a stage 72, a probe 74, an image capturing section 76, and an identifying section 78.

The test circuit 70 has the same configuration as the test apparatus 10 described in FIG. 1, for each device under test 200 that is to be tested. The description of the test circuit 70 includes only differing points.

The wafer unit 210 is mounted on the stage 72, such that the stage 72 contacts each of a plurality of pads arranged respectively on the back surfaces of the devices under test 200. For example, the stage 72 may contact a plurality of pads that are each connected to the collector of a corresponding device under test 200. The stage 72 applies a power supply voltage, which is supplied from the test circuit 70, to the collector of each device under test 200.

The probe 74 contacts each of the pads arranged on the back surfaces of the devices under test 200. For example, the probe 74 may contact each of a plurality of pads connected respectively to the gates of the devices under test 200 and a plurality of pads connected respectively to the emitters of the devices under test 200. The probe 74 applies a gate voltage, which is output from the test circuit 70, to the gate of each device under test 200. Furthermore, the probe 74 applies a ground potential to the emitter of each device under test 200.

The image capturing section 76 captures an image of the wafer unit 210 on which the devices under test 200 are formed, using a camera that detects the temperature distribution of a subject. In this way, the image capturing section 76 can detect the temperature distribution of the surface of the wafer unit 210.

The identifying section 78 identifies the malfunctioning devices under test 200 among the devices under test 200 of the wafer unit 210 based on the temperature distribution acquired by the image capturing section 76. For example, the identifying section 78 may identify the malfunctioning devices under test 200 among the devices under test 200 of the wafer unit 210 based on the temperature of pads arranged on the front surfaces of the devices under test 200. More specifically, the identifying section 78 may identify, as a malfunctioning device under test 200, any device under test 200 that is within a prescribed distance from a location at which the temperature exceeds a prescribed reference temperature.

The identifying section 78 notifies the test circuit 70 concerning devices under test 200 identified as malfunctioning. When the control section 34 that controls the testing of the device under test 200 identified as malfunctioning in the test circuit 70 receives this notification that the device under test 200 is malfunctioning, the control section 34 uses the semiconductor switches 50 in the path through which the power supply voltage is provided to this device under test 200 to cut off the supply of this power supply voltage. The control section 34 then stops the testing of this device under test 200.

When a plurality of devices under test 200 formed on a wafer unit 210 are tested in parallel and a portion of the devices under test 200 malfunction, this test apparatus 10 can stop the testing of only the malfunctioning devices under test 200 and continue testing of the other devices under test 200. Therefore, the test apparatus 10 does not stop the testing for all of the devices under test 200 when some of the devices under test 200 malfunction, and can thereby increase the testing efficiency.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a power supply section that generates a power supply voltage to be supplied to the device under test;
    an inductive load section provided in a path between the power supply section and the device under test;
    a plurality of semiconductor switches connected in series in a path between the inductive load section and the device under test; and
    a control section that turns OFF the semiconductor switches when a supply of voltage to the device under test is stopped.

2. The test apparatus according to claim 1, wherein the control section turns OFF the semiconductor switches when an abnormality occurs in the testing.

3. The test apparatus according to claim 1, further comprising a power supply switch provided in a path between the power supply section and the inductive load section.

4. The test apparatus according to claim 1, wherein the device under test and the semiconductor switches are each an insulated-gate bipolar transistor, and collector-emitter junctions of the semiconductor switches are connected in series.

5. The test apparatus according to claim 1, further comprising an adjusting section that adjusts a waveform of each of a plurality of control signals for respectively turning each of the semiconductor switches ON and OFF.

6. The test apparatus according to claim 5, wherein the adjusting section adjusts a timing at which each control signal is input to the corresponding semiconductor switch.

7. The test apparatus according to claim 5, wherein the adjusting section adjusts a rate of change of each control signal.

8. The test apparatus according to claim 1, further comprising a clamping section that limits voltage in a path between the inductive load section and the semiconductor switches to be within a preset range.

9. The test apparatus according to claim 1, further comprising:
    an image capturing section that captures an image of a unit under test including a plurality of the devices under test, using a camera that detects a temperature distribution of a subject; and
    an identifying section that identifies malfunctioning devices under test among the devices under test included in the unit under test, based on the acquired temperature distribution.

10. The test apparatus according to claim 9, wherein the image capturing section captures an image of a wafer unit in which a plurality of the devices under test are formed or arranged in a wafer shape, and the identifying section identifies malfunctioning devices under test based on the temperature distribution of the wafer unit.

11. The test apparatus according to claim 10, wherein the identifying section identifies the malfunctioning devices under test based on temperature of a pad arranged on the devices under test.

12. The test apparatus according to claim 11, wherein the identifying section identifies, as the malfunctioning devices under test, devices under test that are within a range of a location at which the temperature exceeds a predetermined reference temperature.

* * * * *